(12) United States Patent
Blednov et al.

(10) Patent No.: US 9,325,280 B2
(45) Date of Patent: Apr. 26, 2016

(54) MULTI-WAY DOHERTY AMPLIFIER

(75) Inventors: Igor Blednov, Nijmegen (NL); Josephus H. B. Van Der Zanden, Best (NL)

(73) Assignee: Ampleon Netherlands B.V., Nijmegen (NL)

( * ) Notice: Subject to any disclaimer, the term of this patent is extended or adjusted under 35 U.S.C. 154(b) by 323 days.

(21) Appl. No.: 12/675,849

(22) PCT Filed: Sep. 2, 2008

(86) PCT No.: PCT/IB2008/053543
§ 371 (c)(1),
(2), (4) Date: Mar. 1, 2010

(87) PCT Pub. No.: WO2009/031097
PCT Pub. Date: Mar. 12, 2009

(65) Prior Publication Data
US 2010/0188147 A1    Jul. 29, 2010

(30) Foreign Application Priority Data
Sep. 3, 2007 (EP) .................................. 07115525

(51) Int. Cl.
*H03F 3/68* (2006.01)
*H03F 1/02* (2006.01)
*H03F 1/08* (2006.01)

(52) U.S. Cl.
CPC ............... *H03F 1/0288* (2013.01); *H03F 1/08* (2013.01)

(58) Field of Classification Search
CPC ........................................................ H03F 3/602
USPC ............................................. 330/124 R, 295
See application file for complete search history.

(56) References Cited

U.S. PATENT DOCUMENTS

| | | |
|---|---|---|
| 4,904,966 A | 2/1990 | Rubin |
| 4,928,078 A | 5/1990 | Khandavalli |
| 6,356,149 B1 | 3/2002 | Stengel et al. |
| 6,737,922 B2 * | 5/2004 | Pengelly et al. ............. 330/295 |
| 6,853,245 B2 | 2/2005 | Kim et al. |
| 7,078,976 B2 * | 7/2006 | Blednov ....................... 330/295 |
| 7,262,656 B2 * | 8/2007 | Shiikuma .................. 330/124 R |
| 7,427,895 B1 | 9/2008 | Okubo et al. |

(Continued)

FOREIGN PATENT DOCUMENTS

| | | |
|---|---|---|
| EP | 1 394 932 A1 | 3/2004 |
| EP | 1394932 A1 | 3/2004 |

(Continued)

OTHER PUBLICATIONS

Shrirattana, N., et al; "Analysis and Design of High Efficiency Multistage Doherty Power Amplifier for Wireless Communications"; IEEE Transactions on Microwave Theory and Techniques; vol. 53, No. 3; Mar. 2005.

(Continued)

*Primary Examiner* — Khanh V Nguyen
*Assistant Examiner* — Khiem Nguyen
(74) *Attorney, Agent, or Firm* — McDonnell Boehnen Hulbert & Berghoff LLP

(57) ABSTRACT

An electronic circuit has a multi-way Doherty amplifier. The multi-way Doherty amplifier comprises a two-way Doherty amplifier with a main stage and a first peak stage that are integrated in a semiconductor device; and at least one further peak stage implemented with a discrete power transistor.

12 Claims, 1 Drawing Sheet

(56) References Cited

U.S. PATENT DOCUMENTS

| | | | |
|---|---|---|---|
| 7,453,320 B2* | 11/2008 | Shiikuma | 330/295 |
| 2003/0141933 A1 | 7/2003 | Pengelly | |
| 2004/0113698 A1 | 6/2004 | Kim et al. | |
| 2007/0103237 A1 | 5/2007 | Shiikuma | |
| 2007/0298736 A1 | 12/2007 | Fujioka et al. | |
| 2009/0102553 A1 | 4/2009 | Yang | |
| 2011/0298544 A1 | 12/2011 | Shen | |

FOREIGN PATENT DOCUMENTS

| | | |
|---|---|---|
| EP | 1 677 414 A1 | 7/2006 |
| EP | 1793490 A1 | 6/2007 |
| WO | 2004/088837 A2 | 10/2004 |
| WO | 2004/100215 A2 | 11/2004 |
| WO | 2005/031967 A1 | 4/2005 |
| WO | 2006/102466 A2 | 9/2006 |
| WO | 2006/123289 A2 | 11/2006 |

OTHER PUBLICATIONS

Kim, I., et al; "Highly Linear Three-Way Doherty Amplifier With Uneven Power Drive for Repeater System"; IEEE Microwave and Wireless Components Letters; vol. 16, No. 4; Apr. 2006.

Blednov, Igor, et al; "High-Power LDMOS Integrated Doherty Amplifier for WCDMA"; IEEE Radio Frequency Integrated Circuits (RFIC) Symposium; Jun. 2006.

Wood, Simon M., et al; "A High Power, High Efficiency UMTS Amplifier Using a Novel Doherty Configuration"; Radio and Wireless Conference 2003; IEEE, Piscataway, NJ, US; Aug. 10, 2003; pp. 329-332.

Yang, Y. "A Microwave Doherty Amplifier Employing Envelope Tracking Technique for High Efficiency and Linearity", IEEE Mic. and Wireless Components Ltrs, vol. 13, No. 9, pp. 370-372 (Sep. 1, 2003).

Cha, J. et al. "An Adaptive Bias Controlled Power Amplifier with a Load Modulated Combining Scheme for High Efficiency and Linearity", IEEE MIT-S Digest, vol. 1, pp. 81-84 (Jun. 4, 2003).

\* cited by examiner (202)   $Z_{o1} = Z_{o2} = 2 R_L = R_{L\,P2} = R_{L\,ID}$

MULTI-WAY DOHERTY AMPLIFIER

FIELD OF THE INVENTION

The invention relates to an electronic circuit with a multi-way Doherty amplifier.

BACKGROUND ART

As known, a classical Doherty amplifier has two amplifying devices arranged in parallel and of the same power capability. The first one of the devices (main stage) operates in a class-AB amplifier mode and the second one (peak stage) operates in a class-C amplifier mode. These devices are separated at their inputs and at their outputs by 90° phase-shifting networks. The output phase-shifting network has a specific characteristic impedance $Z_0$ which must be equal to the optimal load impedance $RL_m$ of the main stage. The input signal is split so as to drive the two amplifiers, and a summing network, known as an "impedance inverter" or a "Doherty combiner", is operative to: a) combine the two output signals, b) to correct for phase differences between the two output signals, and c) to provide an inverted impedance at the output of the Doherty amplifier with respect to the impedance as seen from the output of the main stage. Due to the impedance inversion, the main stage operates at load when the input signal level is low, the load then being two times higher than the optimal load $RL_m = 2\ Z_0$ which allows higher power efficiency of the main stage, and also of the Doherty amplifier, while the peak stage remains inactive. The double load at the output of the main stage is possible due to proper arrangement of the output load $RL_D$ of the Doherty amplifier which, for the classical case, is $RL_D = \frac{1}{2}\ Z_0 = \frac{1}{2}\ RL_m$ and which is transformed by the output phase-shifting network to $RL_m = 4\ RL_D$. When the input signal to the Doherty amplifier exceeds a certain level, the output level of the main stage reaches the maximum allowed amplitude and maximum power efficiency and the peak stage is activated and takes over the amplification. Above this level, the load impedance as seen by the main stage drops gradually with growing power level until it reaches its optimal value $Z_0$, which occurs at the peak power level of the Doherty amplifier.

The classic Doherty amplifier is a so-called 2-way amplifier with a main stage and a peak stage. A multi-way (or N-way) Doherty amplifier has a main device and a plurality of peak devices operating in parallel. Advantages of a multi-way Doherty system are well known and are attributed to the increased range of load line control at the output of the main stage. In case of a 2-way symmetrical Doherty amplifier, the load seen by the main stage varies by a factor of two. In case of a classical 3-way Doherty amplifier, this variation is twice larger, and varies by a factor of four. This allows a similar improvement of efficiency, not at 6 dB back-off as for a 2-way Doherty amplifier, but at 12 dB of power back-off, which is currently demanded by new communication systems such as WiMAX (Worldwide Interoperability for Microwave Access). A classical 3-way Doherty requires quarter-wavelength lines between the outputs of the main stage and its first peak stage and also between the outputs of the first and additional peak stages. This makes the design of such a Doherty system very complicated. In addition, such design requires a large space in order to accommodate it, and mass-production samples can be predicted as showing very inconsistent behavior.

A practical implementation is a three-way Doherty amplifier. Examples of N-way Doherty amplifiers are described in, e.g., the following publications: N. Shrirattana et al, "Analysis and Design of High Efficiency Multistage Doherty Power Amplifier for Wireless Communications", IEEE Transactions on Microwave Theory and Techniques, Vol. 53, No. 3, March 2005; I. Kim et al., "Highly Linear Three-Way Doherty Amplifier with Uneven Power Drive for Repeater System" IEEE Microwave and Wireless Components Letters, Vol. 16, No. 4, April 2006; I. Blednov and J. van der Zanden, "High-power LDMOS Integrated Doherty Amplifier for WCDMA", IEEE Radio Frequency Integrated Circuits (RFIC) Symposium, June, 2006. Also see, e.g., U.S. Pat. No. 7,078,976 (Blednov); U.S. Pat. No. 6,853,245 and US published patent application US 20030141933.

SUMMARY OF THE INVENTION

A three-way Doherty amplifier has a higher efficiency and better linearity at back-off levels around 12 dB compared to a two-way Doherty amplifier. See, e.g., the publications of Shrirattana and of Kim mentioned above. However, designing a three-way Doherty amplifier that uses discrete transistors is a very time-consuming task and the quality or performance of such an amplifier is difficult to control in mass production. Under laboratory conditions, a three-way Doherty amplifier shows superior efficiency at 12 dB back-off levels, but these amplifiers are not used on a large scale owing to the complexity of the design and the space needed to implement the design. An asymmetric Doherty design is attractive owing to the good linearity that can be obtained. In an asymmetric configuration, the N-way Doherty amplifier has multiple peak transistor devices, each with a different size and threshold power level. However, the design of a multi-way asymmetrical integrated Doherty amplifier, using the approach described in the publication of Blednov and van der Zanden, is a challenging task owing to the difficulties involved in properly dividing the input power between the main stage, the first peak stage, and the second peak stage and further in combining power outputs of several peak devices of different sizes in an MMIC (Monolithic Microwave Integrated Circuit) environment.

The inventors now propose an alternative approach for designing a multi-way Doherty amplifier. The inventors therefore propose a circuit as claimed in claim 1. The integrated two-way Doherty amplifier is a pre-tested and optimized building block and is used in the invention as if it were a conventional discrete transistor. The multi-way Doherty amplifier design of the invention therefore has a high degree of similarity to a conventional two-way design, and requires less design effort than a two-way Doherty amplifier implemented with discrete transistors. Also, the integrated two-way Doherty amplifier takes up smaller space than a two-way Doherty amplifier implemented with discrete transistors. In addition, the use of an integrated 2-way Doherty amplifier improves the consistence in behavior and in performance of a mass-produced 3-way Doherty amplifier of the invention, owing to fewer components being involved in the design. Furthermore, the design of the Doherty amplifier in the circuit of the invention can be customized in that type, brand, or size of the further peak stage can be chosen from commercially available components and from a variety of conventional technologies (hybrids, PCBs, power devices, etc.), dependent on the customer's needs. For example, the size of the peak stage, integrated in the two-way Doherty amplifier semiconductor device, and the size of the further peak stage, separately implemented in another semiconductor device, can be chosen as being different so as to have the desired behavior. Also, the integrated 2-way Doherty amplifier has the advantage that the main stage therein is kept cooler than if it were a separate semiconductor device. The main stage of a Doherty amplifier dissipates more power than the peak stage. The main stage therefore will generate more heat than the peak stage. As a result of the main stage being integrated on the same die as the peak stage of the integrated Doherty amplifier, twice the area is available for main stage to lose the heat it is generating, e.g., to a heat sink. Accordingly, the main stage of the integrated Doherty amplifier keeps cooler. It is common knowledge in the field of integrated circuitry devices that lowering the temperature of the device by 10° increases the life expectancy of the device by a factor of two.

In embodiments of the circuit of the invention, the further peak stage is connected to an input of the integrated two-way Doherty amplifier via a λ/4 line of a specific impedance, or the devices may be combined via a commercially available hybrid coupler or via other means (e.g., a Wilkinson divider, a rat-race ring coupler, a branch-line coupler, etc.) so as to provide a 90° phase shift between the inputs. This generally provides a good isolation between all ports. As known, the expression "hybrid coupler" refers to a passive device that equally distributes the input power at its input port between its output ports. Wilkinson power dividers are well known in the art. For some background on branch-line couplers see, e.g., U.S. Pat. No. 4,928,078, herein incorporated by reference. For some background on rat-race ring couplers see, e.g., U.S. Pat. No. 4,904,966, incorporated herein by reference.

In another embodiment of the invention relating to a 3-way Doherty amplifier, a first output of the two-way integrated Doherty amplifier is connected to an output node of the 3-way Doherty amplifier via a first λ/2 line or via another structure implementing a 180° phase shift, and a second output of the further peak stage is connected to the output node via a second λ/2 line or via a further structure implementing a 180° phase shift. In this configuration, the first and second λ/2 lines provide the required impedance transformation and take care of the "in-phase" operation of the two-way integrated Doherty amplifier and the further peak stage. At the same time, these lines allow arranging in a proper manner the design and the PCB layout and physically combining two, even very large packaged devices in parallel without loss of performance.

A further improvement of a 3-way Doherty amplifier design and performance can be achieved if the integrated 2-way Doherty amplifier and the further peak stage are arranged on the same metal flange (e.g., 101 of FIG. 1) in a so-called push-pull package (e.g., 103 of FIG. 1), having four RF terminals or leads. This design further decreases the overall size of the 3-way Doherty design and, more importantly, improves the consistence of the behavior and performance of the amplifier in mass production. This especially holds if all semiconductor dies involved are produced within the same wafer in a single production cycle, thus giving rise to very high level of parameter similarity or identity. Also, operation of all semiconductor dies arranged on the same flange, or heat sink, will provide very consistent temperature difference between all dies of the 3-way Doherty system of the invention, and also improve product consistence (e.g., phase and amplitude of combined signals) in mass production. For more background on push-pull packages see, e.g., US published patent application 20070103237, herein incorporated by reference.

BRIEF DESCRIPTION OF THE DRAWINGS

The invention is explained in further detail, by way of example and with reference to the accompanying drawing, wherein.

DETAILED DESCRIPTION OF EMBODIMENTS

Figures 1, 2:
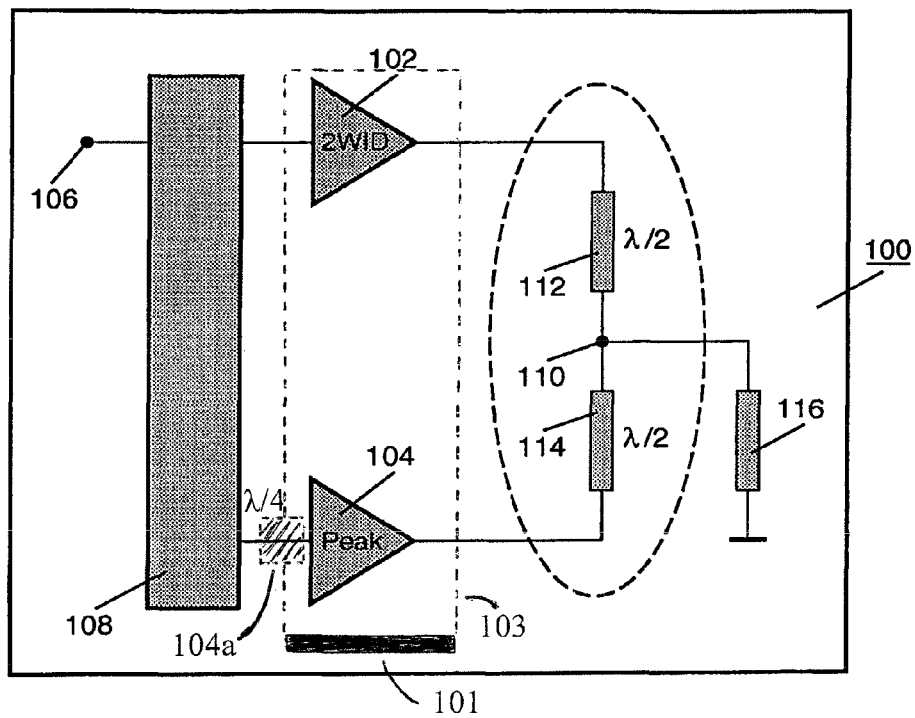
FIG. 1 is a block diagram of a circuit in the invention.
FIG. 2 gives an expression for the output impedance matching.

FIG. 1 is a diagram of an electronic circuit 100 with a multi-way Doherty amplifier that comprises a two-way Doherty amplifier 102, having a main stage and a first peak stage and integrated in a semiconductor device, and at least one further peak stage 104 implemented with a discrete power transistor. Inputs of amplifier 102 and of further peak stage 104 are connected to an input node 106 via an input network 108. Input network 108 comprises, for example, a hybrid coupler between input node 106 and the inputs of amplifiers 102 and 104. Alternatively, input network comprises a λ/4 line of specific impedance (e.g., 104a) between the inputs of amplifiers 102 and 104 so as to implement a 90° phase shift. An output of integrated two-way Doherty amplifier 102 is connected to an output node 110 via a first λ/2 line 112. An output of further peak stage 104 is connected to output node 110 via a second λ/2 line 114. Output node 110 is connected to a load resistance 116. Lines 112 and 114 form an output power combiner.

The required impedance of output lines 112 and 114 is given by expression 202 of FIG. 2. Herein: $Z_{o1}$ and $Z_{o2}$ are the impedances of line 112 and line 114, respectively; $R_L$ is the resistive load of resistance 116; $R_{L\_P2}$ is the resistance experienced by further peak stage 104; $R_{L\_ID}$ is the resistance experienced by integrated Doherty amplifier 102. FIG. 1 illustrates a 3-way Doherty amplifier circuit. It is clear to the person skilled in the art how to extend this circuit to an N-way Doherty amplifier, N being here an integer larger than 3, by means of adding further peak stages and properly designing the power division components as in known N-way Doherty amplifiers.

Having multiple peak stages of different size (giving rise to the asymmetry) and different bias levels allows for further improvement of the linearity by tailoring the overall transfer characteristic of the multi-way Doherty amplifier, without complicating the design compared to classical multi-way Doherty amplifiers. The approach of the invention allows a better linearity owing to a smoother load line control, and greater design flexibility, provides a higher consistence in mass production, and allows for a more rational, simpler and compact design, owing to fewer issues to which the designer is to pay attention.

The invention claimed is:

1. An electronic circuit with a multi-way Doherty amplifier, wherein the multi-way Doherty amplifier comprises:
    a two-way Doherty amplifier comprising a main stage and a first peak stage that are integrated in a semiconductor device;
    at least one further peak stage implemented in a separate semiconductor device,
    a first half-wavelength line connecting an output of the Doherty amplifier to an output node, and
    a second half-wavelength line connecting an output of the at least one further peak stage to the output node.
2. The circuit of claim 1, wherein the further peak stage is implemented with a discrete power transistor.
3. The circuit of claim 1, further including
    an input network connected between an input node and each of the two-way Doherty amplifier and the at least one further peak stage, the input network being configured to provide an input at the input node to the respective Doherty amplifier and further peak stage at a predefined phase shift.

4. The circuit of claim 1, further including
an input network connected between an input node and to each of the two-way Doherty amplifier and the at least one further peak stage, the input network being configured to provide an input at the input node to the respective Doherty amplifier and further peak stage at a predefined phase shift,
the first half-wavelength line connecting the output of the Doherty amplifier to the output node, and
the second half-wavelength line connecting the output of the at least one further peak stage to the output node.

5. The circuit of claim 1, further including
the first half-wavelength line connecting the output of the Doherty amplifier to the output node,
the second half-wavelength line connecting the output of the at least one further peak stage to the output node, and
the impedance of the first and second half-wavelength lines being about equal to twice the resistance of a load connected to the output node.

6. The circuit of claim 1, further including
the first half-wavelength line connecting the output of the Doherty amplifier to the output node connected to a load, and the second half-wavelength line connecting the output of the at least one further peak stage to the output node, and
wherein the resistance of the Doherty amplifier, the resistance of the at least one further peak stage, and the impedance of the first and second half-wavelength lines are about equal to twice the resistance of the load.

7. The circuit of claim 1, wherein the main stage is integrated on a circuit with the first peak stage to transfer heat to the first peak stage, the first peak stage being configured to dissipate heat transferred from the main stage via the circuit.

8. The circuit of claim 1, further including a quarter-wave connector that connects the input of the two-way Doherty amplifier, which is connected to both the main stage and first peak stage, to the input of the at least one further peak amplifier to effect a 90-degree phase shift between the amplifiers.

9. An electronic circuit with a multi-way Doherty amplifier, wherein the multi-way Doherty amplifier comprises:
a two-way Doherty amplifier comprising a main stage and a first peak stage that are integrated in a semiconductor device; and
at least one further peak stage implemented in a separate semiconductor device, wherein the semiconductor device and the separate semiconductor device are arranged together on a metal flange of a push-pull package.

10. An electronic circuit with a multi-way Doherty amplifier, wherein the multi-way Doherty amplifier comprises:
a two-way Doherty amplifier comprising a main stage and a first peak stage that are integrated in a semiconductor device; and
at least one further peak stage implemented in a separate semiconductor device; and
an additional further peak stage implemented in a further separate semiconductor device, wherein the further peak stage and the additional further peak stage have different sizes.

11. A multi-way Doherty amplifier circuit comprising:
a push-pull package;
an input node;
an output node connected to a load circuit;
a two-way Doherty amplifier including a main stage circuit and a first peak stage circuit integrated on a common semiconductor substrate connected to the push-pull package to transfer heat between the main stage circuit and the first peak stage circuit;
a second peak stage circuit comprising a discrete power transistor on a separate semiconductor substrate connected to the push-pull package to transfer heat between the two-way Doherty amplifier and the second peak stage circuit;
an input network connected between the input node and each of the two-way Doherty amplifier and the second peak stage, the input network being configured to provide an input received at the input node to the Doherty amplifier and the second peak stage respectively at a predefined phase shift;
a first half-wavelength line connecting an output of the Doherty amplifier to the output node;
a second half-wavelength line connecting an output of the second peak stage to the output node; and
wherein the resistance of the Doherty amplifier, the resistance of the at least one further peak stage, and the impedance of the first and second half-wavelength lines are about equal to twice the resistance of the load circuit.

12. The circuit of claim 11, further comprising a third peak stage circuit comprising a discrete power transistor on another separate semiconductor substrate connected to the push-pull package to transfer heat between the third peak stage and each of the two-way Doherty amplifier and the second peak stage circuit, the third peak stage being of a different size than the second peak stage.

* * * * *